United States Patent
Wang et al.

(10) Patent No.: US 10,197,876 B2
(45) Date of Patent: Feb. 5, 2019

(54) DISPLAY SUBSTRATE, METHOD FOR MANUFACTURING THE SAME AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan Province (CN)

(72) Inventors: Zhidong Wang, Beijing (CN); Yun Qiu, Beijing (CN); Xue Dong, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 0 days.

(21) Appl. No.: 15/695,155

(22) Filed: Sep. 5, 2017

(65) Prior Publication Data
US 2018/0120657 A1    May 3, 2018

(30) Foreign Application Priority Data
Oct. 31, 2016   (CN) .......................... 2016 1 0928083

(51) Int. Cl.
*G02F 1/13*    (2006.01)
*G02F 1/1362*  (2006.01)
(Continued)

(52) U.S. Cl.
CPC .... *G02F 1/136227* (2013.01); *G02F 1/13338* (2013.01); *H01L 27/323* (2013.01);
(Continued)

(58) Field of Classification Search
CPC ..... G02F 1/01; G02F 1/13; G02F 1/32; G02F 1/133; G02F 1/1333; G02F 1/1335;
(Continued)

(56) References Cited

U.S. PATENT DOCUMENTS 9,891,735 B2 *   2/2018   Bae .................. G06F 3/0412
2005/0139751 A1 * 6/2005  Park .................. G02F 1/1362
                                                  250/208.1
(Continued)

FOREIGN PATENT DOCUMENTS

| CN | 103699282 A | 4/2014 |
|---|---|---|
| CN | 105047088 A | 11/2015 |
| CN | 105607783 A | 5/2016 |

OTHER PUBLICATIONS

First Office Action for Chinese Application No. 201610928083.X, dated Jul. 20, 2018, 7 Pages.

*Primary Examiner* — Xiaoliang Chen
(74) *Attorney, Agent, or Firm* — Brooks Kushman P.C.

(57) ABSTRACT

A display substrate, a method for manufacturing the same and a display device are provided. The display substrate includes a base substrate, wherein a plurality of first touch electrodes is separated from each other and arranged on a first surface of the base substrate, first conductive lines and second conductive lines intersect each other and are arranged on a second surface of the base substrate, and each of the first touch electrodes is electrically connected to the first conductive line through the respective first via hole penetrating the base substrate.

20 Claims, 6 Drawing Sheets

(51) Int. Cl.
*G02F 1/1333* (2006.01)
*H01L 27/32* (2006.01)
*G02F 1/1343* (2006.01)
*H01L 27/108* (2006.01)

(52) U.S. Cl.
CPC .............. *G02F 1/136286* (2013.01); *G02F 2001/134381* (2013.01); *H01L 27/10882* (2013.01)

(58) Field of Classification Search
CPC .......... G06F 3/041; G06F 3/044; G06F 3/045; G06F 3/412; G06F 3/484
USPC .......... 174/266; 345/87, 104, 173, 174, 211; 349/87, 104, 173, 174, 211; 257/40
See application file for complete search history.

(56) References Cited

U.S. PATENT DOCUMENTS

| | | | | |
|---|---|---|---|---|
| 2008/0211394 A1* | 9/2008 | Koshihara | ............... | G06F 3/044 313/504 |
| 2008/0211395 A1* | 9/2008 | Koshihara | ............... | G06F 3/044 313/504 |
| 2010/0013791 A1* | 1/2010 | Haga | .................... | G06F 3/0412 345/174 |
| 2011/0169769 A1* | 7/2011 | Takahashi | ............. | G06F 3/0412 345/174 |
| 2012/0026148 A1* | 2/2012 | Hashimoto | ......... | G09G 3/3655 345/211 |
| 2012/0229408 A1* | 9/2012 | Yamamoto | ............ | G06F 3/0412 345/173 |
| 2014/0168157 A1* | 6/2014 | Yang | ....................... | G06F 3/044 345/174 |
| 2014/0240617 A1* | 8/2014 | Fukutome | ........... | G02F 1/13338 349/12 |
| 2015/0022476 A1* | 1/2015 | Fujioka | .................. | G06F 3/044 345/173 |
| 2015/0144920 A1* | 5/2015 | Yamazaki | ............. | H01L 27/323 257/40 |
| 2016/0011688 A1* | 1/2016 | Wang | ....................... | G06F 3/044 345/174 |
| 2016/0070395 A1* | 3/2016 | Hung | ...................... | G09G 5/003 345/173 |
| 2016/0070406 A1* | 3/2016 | Han | ......................... | G06F 3/044 345/173 |
| 2016/0188061 A1* | 6/2016 | Cho | ...................... | G06F 3/0412 345/173 |
| 2016/0188142 A1* | 6/2016 | Oh | .......................... | G09G 3/36 345/174 |
| 2016/0266678 A1* | 9/2016 | Wang | ....................... | G06F 3/044 |
| 2016/0291777 A1* | 10/2016 | Xi | ......................... | G06F 3/0416 |
| 2016/0299612 A1* | 10/2016 | Lu | ......................... | G06F 3/0412 |
| 2016/0299614 A1* | 10/2016 | Yang | ....................... | G06F 3/044 |
| 2016/0328035 A1* | 11/2016 | Zou | ........................ | G06F 3/041 |
| 2016/0328061 A1* | 11/2016 | Chiang | ................. | G06F 3/0412 |
| 2016/0349559 A1* | 12/2016 | Woo | .................... | G02F 1/13338 |
| 2016/0349881 A1* | 12/2016 | Fukushima | ............. | G06F 3/044 |
| 2017/0038886 A1* | 2/2017 | Zheng | .................... | G06F 3/0412 |
| 2017/0045968 A1* | 2/2017 | Liu | ......................... | G06F 3/044 |
| 2017/0090239 A1* | 3/2017 | Jung | ................. | G02F 1/133308 |
| 2017/0147123 A1* | 5/2017 | Wang | .................... | G06F 3/0416 |
| 2017/0177159 A1* | 6/2017 | Cao | ...................... | G06F 3/0412 |
| 2017/0185210 A1* | 6/2017 | Zhou | .................... | G06F 3/0412 |
| 2017/0192588 A1* | 7/2017 | Zou | ....................... | G06F 3/0416 |
| 2017/0199606 A1* | 7/2017 | Liu | ...................... | G06F 3/0412 |
| 2017/0220148 A1* | 8/2017 | Zhou | ....................... | G06F 3/044 |
| 2017/0277297 A1* | 9/2017 | Li | ............................ | G06F 3/044 |
| 2017/0277349 A1* | 9/2017 | Ding | .................... | G06F 3/0412 |
| 2018/0046277 A1* | 2/2018 | Ding | ....................... | G06F 3/044 |

* cited by examiner

DISPLAY SUBSTRATE, METHOD FOR MANUFACTURING THE SAME AND DISPLAY DEVICE

CROSS-REFERENCE TO RELATED APPLICATION

The present application claims priority to Chinese patent application No. 201610928083.X filed on Oct. 31, 2016, which is incorporated herein by reference in its entirety.

TECHNICAL FIELD

The present disclosure relates to the field of display technology, and more particularly to a display substrate, a method for manufacturing the same and a display device.

BACKGROUND

Nowadays, a display panel having a touching function has become a main product in a display field. At present, a mainstream product is of a monolayer on-cell structure, in which a touch screen is embedded between a color filter substrate and a polarizer of a display screen.

In a touch layer in the above on-cell structure, a junction of column and row electrodes need to be insulated by an insulating layer, and a bridging metal is needed to connect first electrodes. Therefore, on the basis of a manufacturing process of first electrodes and second electrodes, two masking processes need to be added for the insulating layer and the bridging metal respectively, thus complicating the manufacturing process.

SUMMARY

On view of this, the present disclosure provides a display substrate, a method for manufacturing the same and a display device to simplify the manufacturing process.

In one aspect, the present disclosure provides in some embodiments a display substrate including a base substrate. A plurality of first touch electrodes is separated from each other and arranged on a first surface of the base substrate, first conductive lines are arranged on a second surface of the base substrate opposite to the first surface, and at least two of the first touch electrodes are electrically connected to the first conductive line through respective first via holes penetrating through the base substrate.

Optionally, a plurality of second touch electrodes is separated from each other and arranged on the first surface, second conductive lines are arranged on the second surface of the substrate opposite to the first surface and intersect the first conductive lines; the second touch electrodes are arranged in an extension direction of the second conductive line, and at least one of the second touch electrodes in each row or each column is electrically connected to the second conductive line through a respective second via hole penetrating through the base substrate.

Optionally, the plurality of first touch electrodes is arranged in an extension direction of the first conductive line.

Optionally, adjacent second touch electrodes are electrically connected to each other by a touch conductive line in the extension direction of the second conductive line.

Optionally, a first electric conduction pole is arranged in each of the first via holes, and each of the first touch electrodes is electrically connected to the first conductive line through the respective first electric conduction pole.

Optionally, an orthogonal projection of the first electric conduction pole on the base substrate is within an orthogonal projection of the first conductive line on the base substrate.

Optionally, a second electric conduction pole is arranged in each of the second via holes, and at least one of the second touch electrodes in each row or each column is electrically connected to the second conductive line through the respective second electric conduction pole.

Optionally, an orthogonal projection of the second electric conduction pole on the base substrate is within an orthogonal projection of the second conductive line on the base substrate.

Optionally, on an inner wall of the first via hole, on an inner wall of the second via hole, or on the inner wall of each of the first via hole and the second via hole, an insulating layer, an adhesive layer, a barrier layer and an electroplating seed layer are arranged sequentially in a direction departing from the inner wall.

Optionally, the first conductive lines are gate lines, and the second conductive lines are data lines; or the first conductive lines are the data lines, and the second conductive lines are the gate lines.

In another aspect, the present disclosure provides in some embodiments a display device, including the display substrate provided by any one of the embodiments of the present disclosure.

Optionally, in the display device, the first conductive lines are data lines, the second conductive lines are gate lines, the display device further includes a gate driving circuit arranged on the second surface of the base substrate, and the gate driving circuit is also a driving circuit for the second touch electrodes.

Furthermore, the present disclosure further provides a method for manufacturing the display substrate, including: providing a base substrate; forming a plurality of first via holes and a plurality of second via holes in the base substrate, wherein each of the first via holes and the second via holes penetrates through the base substrate; and forming a plurality of first touch electrodes on a first surface of the base substrate, wherein the first touch electrodes are separated from each other, and each of the first touch electrodes is electrically connected to the first conductive line through the respective first via hole penetrating through the base substrate.

Optionally, after forming the plurality of first via holes and the plurality of second via holes in the base substrate, the method further includes: forming a plurality of second touch electrodes on the first surface of the base substrate, and forming first conductive lines and second conductive lines on a second surface of the base substrate opposite to the first surface, wherein the second touch electrodes are separated from each other, the first conductive lines intersect the second conductive lines, the second touch electrodes are arranged in an extension direction of the second conductive line, adjacent second touch electrodes are electrically connected to each other by a touch conductive line, and at least one of the second touch electrodes in each row or each column is electrically connected to the second conductive line through the respective second via hole.

Optionally, after forming the plurality of first via holes and the plurality of second via holes in the base substrate, the method further includes: forming first electric conduction poles in the first via holes respectively, and forming second electric conduction poles in the second via holes respectively.

Optionally, after forming the plurality of via holes in the base substrate, the method further includes: forming first electric conduction poles and second electric conduction poles in the via holes such that the first touch electrodes are electrically connected to the first conductive line through a respective first electric conduction pole, at least one of the second touch electrodes in each row and each column is electrically connected to the second conductive line through a respective second electric conduction pole.

Optionally, forming the first electric conduction poles in the first via holes respectively and forming the second electric conduction poles in the second via holes respectively includes: forming an insulating layer, an adhesive layer, a barrier layer and an electroplating seed layer sequentially on an inner wall of each of the first via holes and the second via holes, and filling each of the via holes with metal through an electroplating process to form the first electric conduction poles and the second electric conduction poles.

Optionally, forming the plurality of first via holes and the plurality of second via holes in the base substrate includes: forming the plurality of first via holes and the plurality of second via holes through an ultraviolet photoetching process, an X-ray direct-writing process, a laser etching process or a patterning process.

BRIEF DESCRIPTION OF THE DRAWINGS

In order to make the technical solutions in embodiments of the present disclosure more apparent, drawings need to be used in the embodiments will be briefly described hereinafter. Obviously, drawings in the following descriptions are merely some of the embodiments of the present disclosure, and based on these drawings, a person skilled in the art may obtain other drawings without any creative labors.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

Figure 1:
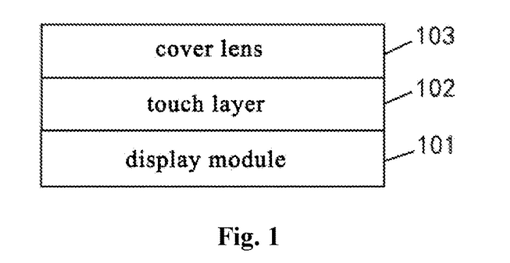
FIG. 1 is a schematic view showing a structure of a display device in a related art.
Figure 2:
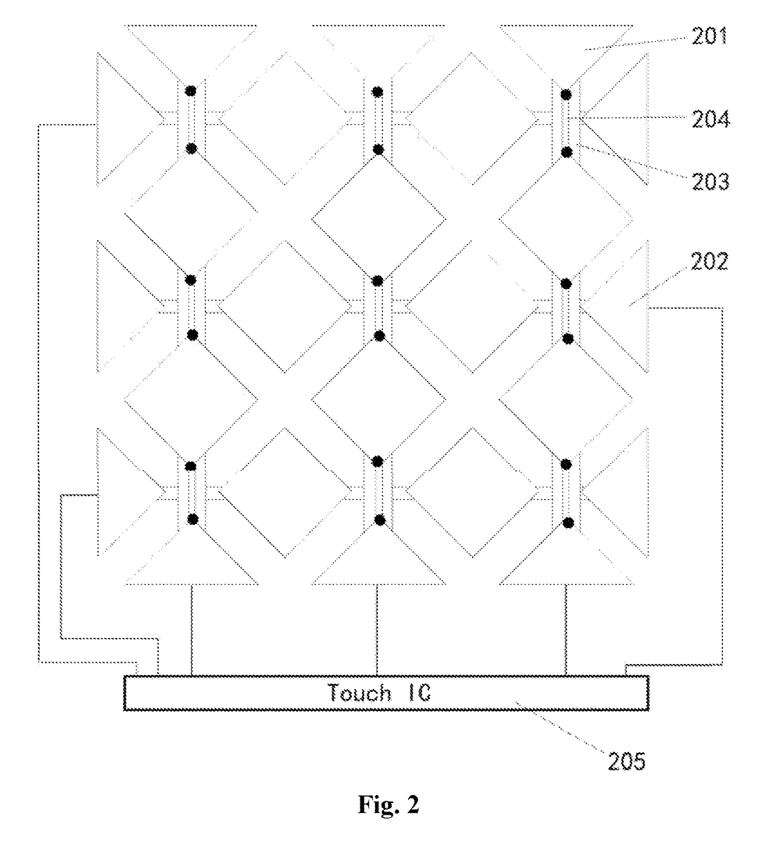
FIG. 2 is a schematic view showing a distribution of touch electrodes in the related art.

As shown in FIG. 1, a monolayer on-cell structure includes a display module 101, a touch layer 102 arranged on the display module 101, and a cover lens 103. As shown in FIG. 2, in the touch layer, first electrodes 201 in columns and second electrodes 202 in rows intersects each other and are made of a conducting layer of a same layer and isolated by an insulating layer 203 at their junctions, the first electrodes 201 are connected through bridging electrodes 204, and the second electrodes are connected to a touch integrated circuit (IC) 205 by wires.

Figure 3A:
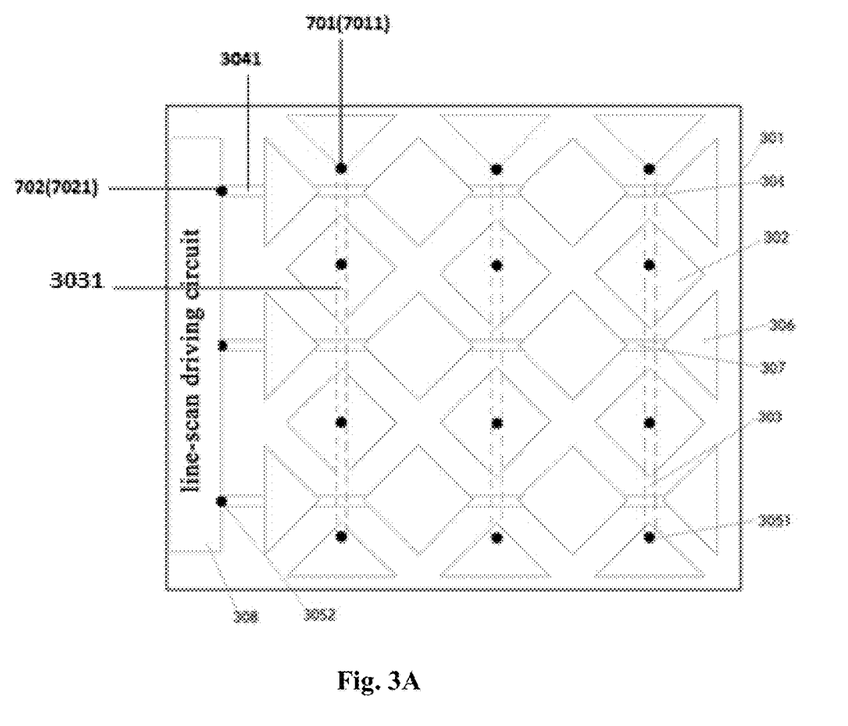
FIG. 3A is a schematic view showing a distribution of electrodes at a side of display substrate according to embodiments of the present disclosure.
Figure 3B:
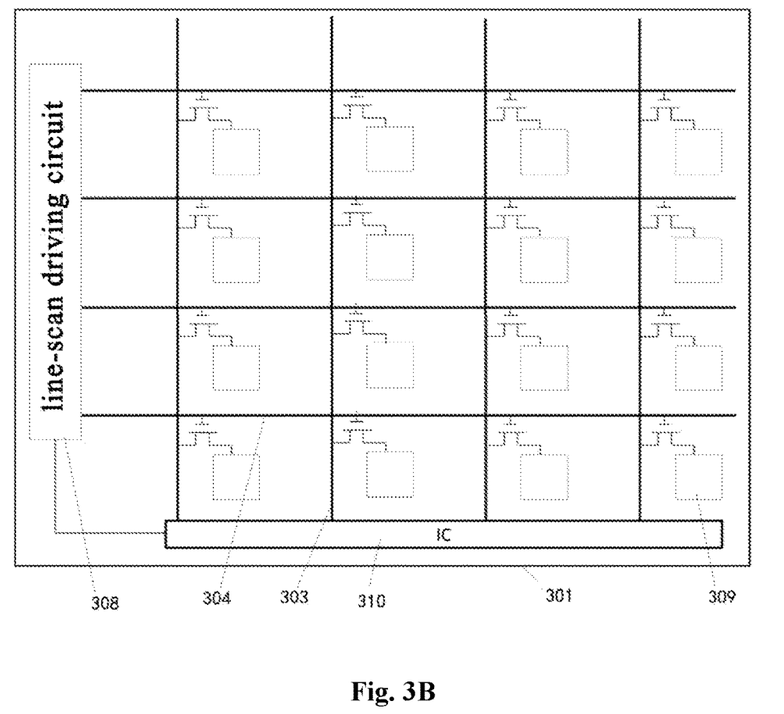
FIG. 3B is a schematic view showing conductive lines at the other side of the display substrate according to embodiments of the present disclosure.
Figure 3C:
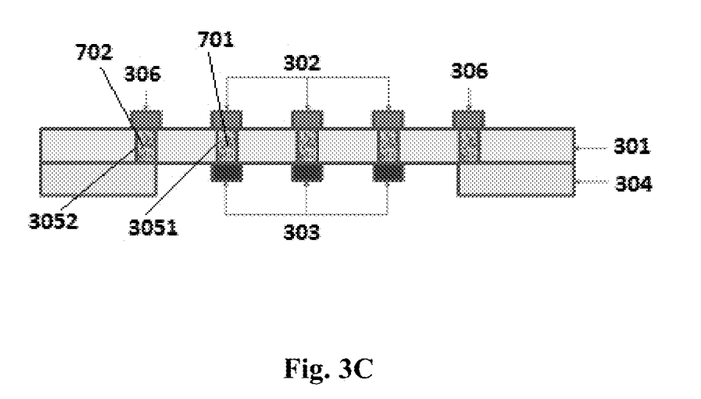
FIG. 3C is a cross section of display substrate.

The present disclosure provides in some embodiments a display substrate. As shown in FIG. 3A to FIG. 3C, the display substrate includes a base substrate 301, a plurality of first touch electrodes 302 is separated from each other and arranged on a first surface of the base substrate 301, first conductive lines 303 and second conductive lines 304 intersects each other and are arranged on a second surface of the base substrate 301, each of the first touch electrodes 302 is electrically connected to the first conductive line 303 through the respective first via hole 3051 penetrating through the base substrate 301. FIG. 3A shows a side of the base substrate 301 where the first touch electrodes 302 are arranged, FIG. 3B shows the other side of the base substrate 301 where the first conductive lines 303 and the second conductive lines 304, and FIG. 3C shows the cross section of the base substrate 301. The first conductive lines 303 and the second conductive lines 304 define a plurality of sub-pixel regions 309. Furthermore, the second touch electrodes are electrically connected to the second conductive line 304 through respective second via holes 3052.

In the above solution, a plurality of via holes penetrating through the base substrate are formed in the base substrate, the first touch electrodes are electrically connected to the first conductive line through respective via holes, thus simplifying a connection of the first touch electrodes and the first conductive lines. Since the first conductive lines and the second conductive lines are electrically connected to the touch IC, the first touch electrodes and the second touch electrodes may electrically connected to the touch IC through the first conductive lines and the respective second conductive lines respectively. Therefore, there is no need to arrange an additional insulating layer between the first touch electrodes and the second touch electrodes; instead, the base substrate is also an insulating layer, thus the masking processes may be reduced.

In the case that the touch electrodes are electrically connected to the data line through respective via holes, the touch electrodes are applied with a voltage even in the display mode, which may adversely affect the display quality. In order to solve this problem, the display mode and the touch mode may be driven in a time-division manner. The display function and the touch function are implemented in different time periods. During the period of implementing the displaying function, the touch function is not implemented, and therefore no voltage is applied to the touch electrodes, and thus it may not adversely affect the display quality.

In some embodiments of the present disclosure, the first conductive line is one of a gate line and a data line, and the second conductive line is the other one of the gate line and the data line.

In the case that each of the first touch electrodes is electrically connected to the first conductive line through the respective first via hole penetrating through the base substrate, second touch electrodes are arranged at a same side of the base substrate as the first touch electrodes, the second touch electrodes may be electrically connected to the second conductive line through respective electrical wires arranged on the base substrate.

In some embodiments of the present disclosure, still referring FIG. 3A and FIG. 3B, in the case that each of the first touch electrodes 302 is electrically connected to the first conductive line 303 through the respective first via hole 3051 penetrating through the base substrate 301, the first touch electrodes 302 are arranged in an extension direction of the first conductive line 303.

In some specific embodiments, in the case that second touch electrodes are arranged on the base substrate, the second touch electrodes are arranged in an extension direction of the second conductive line.

In some embodiments of the present disclosure, still referring to FIG. 3A and FIG. 3B, a plurality of second touch electrodes 306 are further arranged in an extension direction of the second conductive line 304 on the first surface, adjacent second touch electrodes 306 are electrically connected to each other by a touch conductive line 307 in the extension direction of the second conductive line 304, and at least one of the second touch electrodes 306 in each row or each column is electrically connected to the second conductive line 304 through a respective second via hole 3052, and is electrically connected to a line-scan driving circuit 308 through the second conductive line 304. In a specific embodiment, in the case that the second conductive lines 304 extends in a row direction, at least one of the second touch electrodes 306 in each row is electrically connected to the second conductive line 304 through a respective second via hole 3052; in the case that the second conductive line 304 extends in a column direction, at least one of the second touch electrodes 306 in each column is electrically connected to the second conductive line 304 through a respective second via hole 3052, therefore the touch IC and the display IC 310 may be combined.

In an embodiment, a first electric conduction pole 701 is arranged in each of the first via holes, and each of the first touch electrodes is electrically connected to the first conductive line through a respective first electric conduction pole 701. In this embodiment, the base substrate includes a plurality of via holes penetrating through the base substrate, the via holes include first via holes and second via holes, a electric conduction pole is arranged in each of the via holes, conductive lines in rows and conductive lines in columns intersect each other for an arrangement of sub-pixel display units, and are arranged on one surface of the base substrate, the electric conduction poles in the sub-pixel display units are electrically connected to thin film transistors (TFTs) in the sub-pixel display unit or the respective conductive lines. In this way, the base substrate may be cut freely, after cutting the base substrate into any shapes and sizes as desired, a driving circuit including first conductive lines and second conductive lines may be arranged on the other surface of the base substrate, and realize an electrical connection between the first conductive lines and first touch electrodes through respective electric conduction poles.

In some embodiments of the present disclosure, an orthogonal projection 7011 of the first electric conduction pole 701 on the base substrate is within an orthogonal projection 3031 of the first conductive line on the base substrate. As a result, a location of the first touch electrode exactly covers one end of the first electric conduction pole 701, a location of the first conductive line exactly covers the other end of the first electric conduction pole 701, such that the first touch electrode is electrically connected to the first conductive line through the first electric conduction pole.

In some embodiments of the present disclosure, a second electric conduction pole 702 is arranged in each of the second via holes, via holes provided with the first electric conduction pole 701 are first via holes, via holes provided with the second electric conduction pole 702 are second via holes, the first via holes and the second via holes are separated from each other. At least one of the second touch electrodes in each row or each column is electrically connected to the second conductive line through a respective second electric conduction pole 702. The first electric conduction pole 701 and the second electric conduction pole 702 are located in different via holes respectively, such that the base substrate may functions to insulate the first touch electrodes from the second touch electrodes without additionally arranging an insulating layer and a bridging metal layer. In addition, the first touch electrodes and the second touch electrodes are not required to be connected to two sides of the base substrate by wires, so as to narrow a bezel.

In some embodiments of the present disclosure, an orthogonal projection 7021 of the second electric conduction pole 702 on the base substrate is within an orthogonal projection 3041 of the second conductive line on the base substrate. As a result, a location of the second touch electrode exactly covers one end of the second electric conduction pole 702, and a location of the second conductive line exactly covers the other end of the second electric conduction pole 702, such that the second touch electrode is electrically connected to the second conductive line through the second electric conduction pole 702.

In optional embodiments of the present disclosure, first conductive lines and second conductive lines are arranged at one side of the base substrate, the first touch electrodes and the second touch electrodes are arranged at the other side of the base substrate; via holes penetrating from one side to the other side of the base substrate are further arranged in the base substrate, the via holes include first via holes and second via holes, the first touch electrodes are electrically connected to the first conductive line through respective first electric conduction poles 701 arranged in the first via holes, the second touch electrodes are electrically connected to the second conductive line through respective second electric conduction poles 702 arranged in the second via holes, the first conductive lines are data lines, the second conductive lines are gate lines, adjacent two second touch electrodes are electrically connected to each other in the extension direction of the second conductive line. In this embodiment, via holes are formed in a glass base substrate and each of the via holes is filled with metal, such that a display structure and a touch structure formed at two sides of the base substrate respectively are connected to each other, that is, the first touch electrodes for receiving a touch signal are electrically connected to the data lines, and the second touch electrodes are connected to the line-scan driving circuit through the gate lines, therefore the processes for manufacturing the insulating layer and the bridging metal in the related art are not required, and the touch electrode wires and the touch IC are also not required. The touch IC and the display IC may be combined, thereby to reduce the cost, narrow the bezel, and obtain a thin and light display product.

In addition, the present disclosure further provides a display device, including the display substrate provided by any one of the embodiments of the present disclosure.

In some embodiments of the present disclosure, the first conductive lines are data lines, the second conductive lines are gate lines, the display device further includes a gate driving circuit arranged on the second surface of the base substrate, and the gate driving circuit is also a driving circuit for the second touch electrodes.

Figure 5:
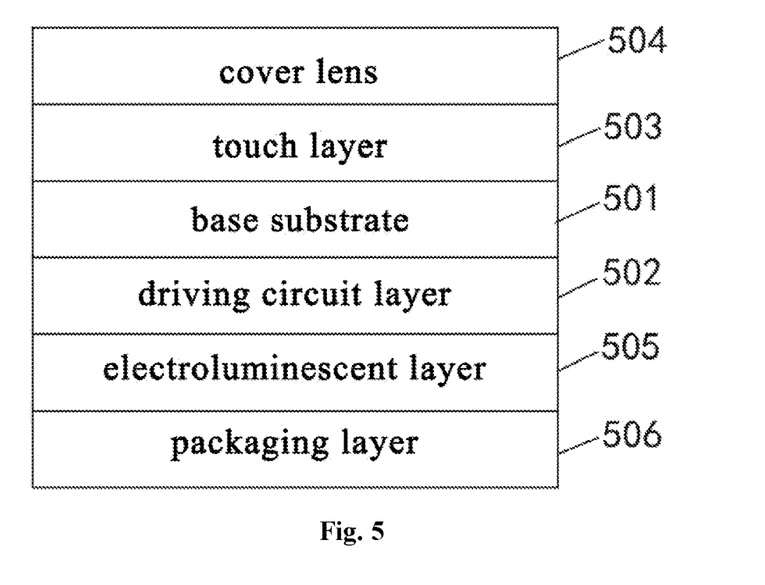
FIG. 5 is a schematic view showing a structure of a display device according to embodiments of the present disclosure.

As shown in FIG. 5, a driving layer of the display device and a touch layer including first touch electrodes and second touch electrodes of the display substrate share a base substrate 501, touch electrodes of a touch layer 503 and driving circuit layer 502 including gate lines and data lines are arranged at two sides of the base substrate 501 respectively, and the base substrate 501 includes via holes filled with conductive metal. The first touch electrodes of the touch layer 503 are connected to the data lines in the driving circuit layer through the respective first via holes, the second touch electrodes of the touch layer 503 are connected to a line-scan driving circuit in the driving circuit layer 502 via the gate lines in the driving circuit layer 502 through the respective second via holes, wherein the line-scan driving circuit may be a time division multiplexing circuit in the related art, and may be any circuit for driving the gate lines and the second touch electrodes in the time division manner. Meanwhile, a cover lens 504 is further arranged at a side of the touch layer 503 away from the base substrate 501, and an electroluminescent layer 505 and a packaging layer 506 may be further arranged at a side of the driving circuit layer 502 away from the base substrate 501.

Figure 4:
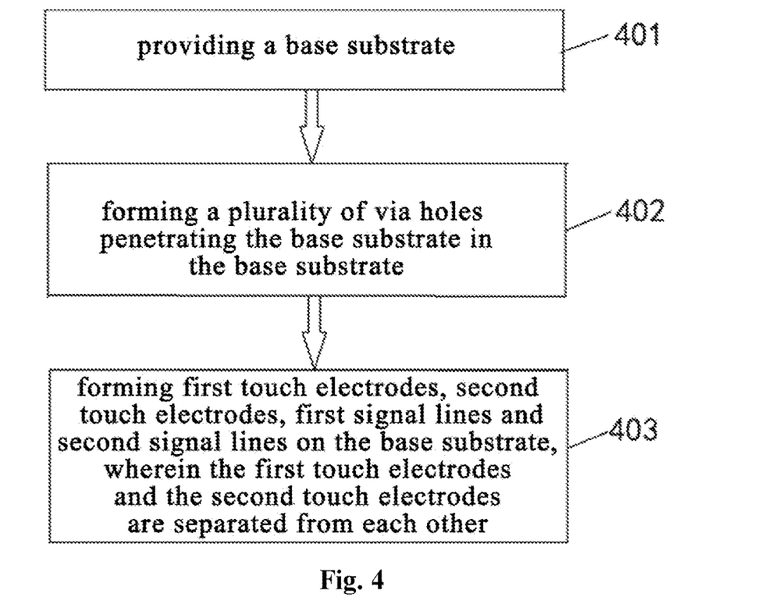
FIG. 4 is a flowchart showing a method for manufacturing the display substrate according to embodiments of the present disclosure.
Figure 6A:
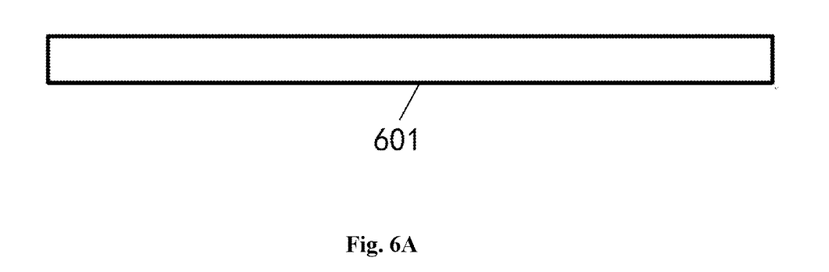
FIG. 6A is a schematic view showing a base substrate according to embodiments of the present disclosure.
Figure 6B:
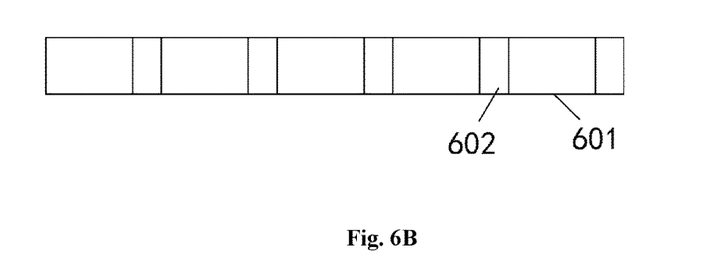
FIG. 6B is a schematic view showing formation of via holes in the base substrate according to embodiments of the present disclosure.

Furthermore, the present disclosure further provides a method for manufacturing a display substrate, and the method includes the following steps as shown in FIG. 4. Step 401: providing a base substrate 601 as shown in FIG. 6A. Step 402: forming a plurality of via holes 602 in the base substrate 601 as shown in FIG. 6B, wherein each of the via holes 602 penetrates through the base substrate 601; specifically, the via holes 602 may be formed in the base substrate 601 by a drilling process, wherein the drilling process may be implemented in a mechanical manner, a laser manner, an etching manner, an ultraviolet irradiating manner, or the like, and the via holes 602 include first via holes and second via holes. Step 403: forming a plurality of first touch electrodes and a plurality of second touch electrodes on a first surface of the base substrate, wherein the first touch electrodes and the second touch electrodes are separated from each other; forming first conductive lines and second conductive lines intersecting each other on a second surface of the base substrate opposite to the first surface; the second touch electrodes are arranged in an extension direction of the second conductive line, and each of the first touch electrodes is electrically connected to the first conductive line through a respective first via hole penetrating through the base substrate, adjacent second touch electrodes are electrically connected to each other by a touch conductive line, and at least one of the touch electrodes in each row or each column is electrically connected to the second conductive line through a respective second via hole.

During a process of manufacturing the display device, an electroluminescent layer and a packaging layer are formed after forming the first conductive lines and the second conductive lines, wherein the display device emits light in a bottom-light emitting manner, which is technically mature and of high reliability. In an optional embodiment, in the process of manufacturing the display device, a driving circuit layer including first conductive lines and second conductive lines, an electroluminescent layer, and a packaging layer are formed at one side of the base substrate, and then first touch electrodes and second touch electrodes are formed at the other side of the base substrate, and a cover lens is formed to protect the first touch electrodes and the second touch electrodes.

In some embodiments of the present disclosure, forming the plurality of via holes penetrating the base substrate in the base substrate includes: forming the plurality of via holes penetrating through the base substrate in the base substrate through an ultraviolet photoetching process, an X-ray direct-writing process, a laser etching process or a patterning process.

In some embodiments of the present disclosure, after forming the plurality of via holes penetrating through the base substrate in the base substrate, the method further includes: forming first electric conduction poles in the first via holes respectively, and forming second electric conduction poles in the second via holes respectively, such that each of the first touch electrodes is electrically connected to the first conductive line through the respective first electric conduction pole, and at least one of the second touch electrodes in each row or each column is electrically connected to the second conductive line through the respective second electric conduction pole.

Figure 6C:
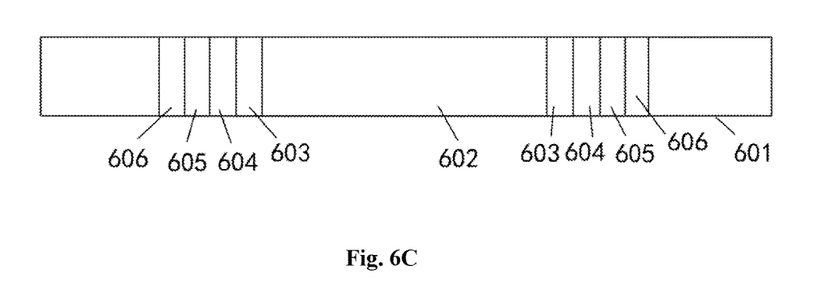
FIG. 6C is a schematic view showing a structure of via holes in the base substrate according to embodiments of the present disclosure.

In some embodiments of the present disclosure, forming the first electric conduction poles and the second electric conduction poles in the via holes includes: as shown in FIG. 6C, forming an insulating layer 603, an adhesive layer 604, a barrier layer 605 and an electroplating seed layer 606 sequentially on an inner wall of each of the via holes, and filling each of the via holes with metal through an electroplating process to form first electric conduction poles and second electric conduction poles in the first via holes and the second via hole respectively. Since a quartz substrate or a glass substrate are usually adopted as the base substrate, an adhesive force between the quartz substrate and the metal or an adhesive force between the glass substrate and the metal are weak, and it may cause an adhesive force between the electric conduction poles and the via holes weak if the electric conduction poles are formed in the via holes directly. Therefore, firstly an insulating layer is formed on the inner wall of each of the via holes, wherein the adhesive force between the insulating layer and the base substrate is strong; and then after that, an adhesive layer with good adhesive capability is formed on the insulating layer; and then after that, a barrier layer is formed on the adhesive layer, wherein the barrier layer may block impurities in the adhesive layer and the insulating layer; and then after that, an electroplating seed layer is formed on the barrier layer, and each of the via holes is filled with metal through an electroplating process to form electric conduction poles.

It should be understood that, the plurality of embodiments described in the present disclosure is merely used to illustrate the present disclosure, rather than to limit the present disclosure. Moreover, the embodiments in the present disclosure and features in the embodiments may be combined with each other if no conflict occurs.

Apparently, a person skilled in the art may make modifications and variations without departing from the principle and the scope of the present disclosure. Therefore, if these modifications and variations fall within the scope of the claims of present disclosure and the equivalents thereof, the present disclosure is intended to include these modifications and variations.

What is claimed is:

1. A display substrate, comprising a base substrate, wherein
   a plurality of first touch electrodes is separated from each other and arranged on a first surface of the base substrate, first conductive lines are arranged on a second surface of the base substrate opposite to the first surface, and at least two of the first touch electrodes are electrically connected to one of the first conductive lines through respective first via holes penetrating through the base substrate; and
   on an inner wall of the first via holes, an insulating layer, an adhesive layer, a barrier layer, and an electroplating seed layer are arranged sequentially in a direction departing from the inner wall.

2. The display substrate according to claim 1, wherein
   a plurality of second touch electrodes is separated from each other and arranged on the first surface, second conductive lines are arranged on the second surface of the substrate opposite to the first surface and intersect the first conductive lines; the second touch electrodes are arranged in an extension direction of the second conductive line, and at least one of the second touch electrodes in each row or each column is electrically connected to one of the second conductive lines through respective second via holes penetrating through the base substrate.

3. The display substrate according to claim 1, wherein
   the plurality of first touch electrodes is arranged in an extension direction of the first conductive line.

4. The display substrate according to claim 2, wherein
   adjacent second touch electrodes are electrically connected to each other by a touch conductive line in the extension direction of the second conductive line.

5. The display substrate according to claim 1, wherein
   a first electric conduction pole is arranged in each of the first via holes, and each of the first touch electrodes is electrically connected to the first conductive line through the respective first electric conduction pole.

6. The display substrate according to claim 5, wherein
   an orthogonal projection of the first electric conduction pole on the base substrate is within an orthogonal projection of the first conductive line on the base substrate.

7. The display substrate according to claim 4, wherein
   a second electric conduction pole is arranged in each of the second via holes, and at least one of the second touch electrodes in each row or each column is electrically connected to the second conductive line through the respective second electric conduction pole.

8. The display substrate according to claim 7, wherein
   an orthogonal projection of the second electric conduction pole on the base substrate is within an orthogonal projection of the second conductive line on the base substrate.

9. The display substrate according to claim 8, wherein
   on an inner wall of the second via holes, an insulating layer, an adhesive layer, a barrier layer and an electroplating seed layer are arranged sequentially in a direction departing from the inner wall of the second via holes.

10. The display substrate according to claim 2, wherein
    the first conductive lines are gate lines, and the second conductive lines are data lines; or
    the first conductive lines are the data lines, and the second conductive lines are the gate lines.

11. A display device, comprising the display substrate according to claim 1.

12. The display device according to claim 11, wherein
    a plurality of second touch electrodes is separated from each other and arranged on the first surface, second conductive lines are arranged on the second surface of the substrate opposite to the first surface and intersect the first conductive lines; the second touch electrodes are arranged in an extension direction of the second conductive line, and at least one of the second touch electrodes in each row or each column is electrically connected to the second conductive line through respective second via holes penetrating through the base substrate.

13. The display device according to claim 12, wherein
    the first conductive lines are data lines, the second conductive lines are gate lines, the display device further comprises a gate driving circuit arranged on the second surface of the base substrate, and the gate driving circuit is also a driving circuit for the second touch electrodes.

14. The display device according to claim 11, wherein
    the plurality of first touch electrodes is arranged in an extension direction of the first conductive line.

15. The display device according to claim 12, wherein
    adjacent second touch electrodes are electrically connected to each other by a touch conductive line in the extension direction of the second conductive line.

16. A method for manufacturing a display substrate comprising a base substrate, wherein a plurality of first touch electrodes is separated from each other and arranged on a first surface of the base substrate, first conductive lines are arranged on a second surface of the base substrate opposite to the first surface, at least two of the first touch electrodes are electrically connected to one of the first conductive lines through respective first via holes penetrating through the base substrate, and on an inner wall of the first via holes, an insulating layer, an adhesive layer, a barrier layer, and an electroplating seed layer are arranged sequentially in a direction departing from the inner wall,
    wherein the method comprises:
    providing a base substrate;
    forming a plurality of first via holes and a plurality of second via holes in the base substrate, wherein each of the first via holes and the second via holes penetrates through the base substrate; and
    forming a plurality of first touch electrodes on a first surface of the base substrate, wherein the first touch electrodes are separated from each other, and each of the first touch electrodes is electrically connected to a first conductive line through the respective first via holes penetrating through the base substrate.

17. The method according to claim 16, wherein after forming the plurality of first via holes and the plurality of second via holes in the base substrate, the method further comprises:
    forming a plurality of second touch electrodes on the first surface of the base substrate, and forming first conductive lines and second conductive lines on a second surface of the base substrate opposite to the first surface, wherein the second touch electrodes are separated from each other, the first conductive lines intersect the second conductive lines, the second touch electrodes are arranged in an extension direction of the second conductive line, adjacent second touch electrodes are electrically connected to each other by a touch conductive line, and at least one of the second touch electrodes in each row or each column is electrically connected to the second conductive line through the respective second via holes.

18. The method according to claim 16, wherein after forming the plurality of first via holes and the plurality of second via holes in the base substrate, the method further comprises:

forming first electric conduction poles in the first via holes respectively, and forming second electric conduction poles in the second via holes respectively.

19. The method according to claim 18, wherein forming the first electric conduction poles in the first via holes respectively and forming the second electric conduction poles in the second via holes respectively comprises:

forming an insulating layer, an adhesive layer, a barrier layer and an electroplating seed layer sequentially on an inner wall of each of the first via holes and the second via holes, and filling each of the first via holes and the second via holes with metal through an electroplating process to form the first electric conduction poles and the second electric conduction poles.

20. The method according to claim 16, wherein forming the plurality of first via holes and the plurality of second via holes in the base substrate comprises:

forming the plurality of first via holes and the plurality of second via holes through an ultraviolet photoetching process, an X-ray direct-writing process, a laser etching process or a patterning process.

* * * * *